United States Patent
Chang et al.

[11] Patent Number: 6,084,484
[45] Date of Patent: Jul. 4, 2000

[54] PROGRAMMABLE PRECISE FREQUENCY DIVIDER

[75] Inventors: Herman Chang, Hsinchu; Yueh-Mei Hou, Taoyuan Hsien, both of Taiwan

[73] Assignee: Holtek Semiconductor Inc., Hsinchu, Taiwan

[21] Appl. No.: 09/181,707

[22] Filed: Oct. 28, 1998

Related U.S. Application Data

[63] Continuation of application No. 08/739,057, Oct. 28, 1996, abandoned.

[51] Int. Cl.[7] .................................................. H03B 1/00
[52] U.S. Cl. .............................. 331/75; 331/179; 327/117
[58] Field of Search ................................ 331/14, 16, 25, 331/74, 75, 179; 327/105–107, 156–159, 115, 117, 118; 379/376

[56] References Cited

U.S. PATENT DOCUMENTS 4,754,465  6/1988  Trimble ........................................ 375/1

*Primary Examiner*—David Mis
*Attorney, Agent, or Firm*—W. Wayne Liauh

[57] ABSTRACT

A programmable precise frequency divider cooperating with a low frequency crystal and an oscillating circuit is disclosed. The divider includes a low frequency oscillating circuit, a preset code memory, a programmable preset code loader, an adder, and a register. The programmable preset code loader loads and latches a preset code either from the preset code memory or a preset code input line coupled to an external data source. The latched preset code and the current value of the register are commonly supplied to the adder. The adder is used to sum up the latched preset code from the programmable preset code loader and the current value from the register and thereby supply a resultant value to the register. The register accumulates the resultant value from the adder to the oscillating signal from the oscillating circuit and then supplies a output clock signal with a required divided frequency.

6 Claims, 3 Drawing Sheets

PROGRAMMABLE PRECISE FREQUENCY DIVIDER

This is a continuation of application Ser. No. 08/739,057, filed Oct. 28, 1996, abandoned.

BACKGROUND OF THE INVENTION

1. Field of the Invention

The present invention relates to a digital frequency divider, and more particularly to a programmable digital frequency divider employing a low frequency crystal and an oscillating circuit for generating an output clock signal with a precise divided frequency.

2. Brief Description of the Prior Art

It is an inevitable trend to design miniature and low cost integrated circuits in the future. It is an important point not only to improve the internal circuit arrangement of the integrated circuit but also to enhance the performance of the integrated circuit and reduce the manufacture cost.

It is known that a piezoelectric crystal is used to supply a source of basic clock signals to provide local timing control for a crystal based oscillator. The oscillator frequency is essentially determined by the crystal.

FIG. 1 illustrates a functional block diagram of a conventional digital frequency divider which mainly includes a crystal 10, a high frequency oscillating circuit 11, and a plural stages of frequency dividing units 12a, 12b, 12c, etc. The frequency dividing units 12a, 12b, and 12c are capable of generating various output clock signals with different frequencies on respective clock output lines 13a, 13b, 13c, etc. It is noted that this type of conventional digital frequency divider has the following limitations:

1. A high frequency crystal must be used in order to obtain a variety of output clock signals with different frequencies, which means that the component cost is relatively high.
2. The conventional divider is limited to provide an output signal with a frequency equal to the frequency of the input clock signal divided by an integer. In case that the divider can not generate an output signal with an exactly required output frequency, another crystal element with higher frequency must be used.
3. It is required to re-design the logic circuit of the divider once the system frequency of the divider is changed, which will waste much time in circuit design. In addition, the specifications of the major electronic components of the divider must be changed or modified.

It is obvious that the drawbacks of the conventional frequency divider described above are extremely disadvantageous to the integrated circuit product both in scale and manufacturing cost.

SUMMARY OF THE INVENTION

For obviating the aforementioned drawbacks and problems found in the conventional frequency divider, it is the primary object of the present invention to provide an improved digital frequency divider capable of generating an output clock signal with a precise output frequency. In accordance with the present invention, the divider just employs a low cost crystal and a low frequency oscillating circuit as an input clock signal.

The other object of the present invention is to provide a programmable digital frequency divider. In accordance with the present invention, it is possible to program the divider by simply changing a preset code either to a preset code memory or an external data source to generate various output clock signals.

The other object of the present invention is to provide a miniature integrated circuit configuration by simplifying the logic circuit therein and thereby the product cost may be reduced.

In order that the present invention may more readily be understood, the following description is given, merely by way of example, reference being made to the accompanying drawings.

DESCRIPTION OF THE PREFERRED EMBODIMENT

Figure 1:
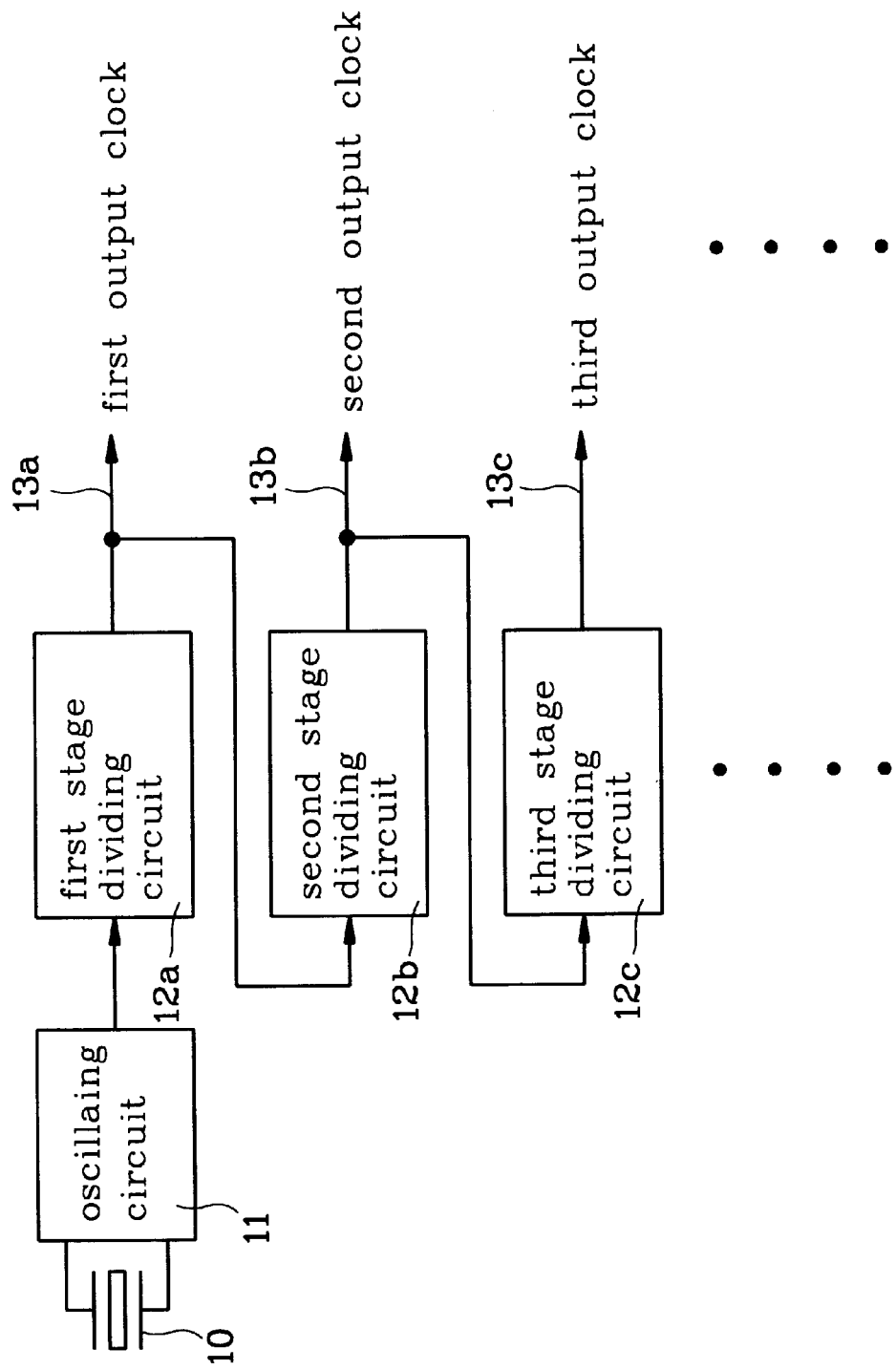
FIG. 1 illustrates a functional block diagram of the conventional frequency dividing circuit.
Figure 2:
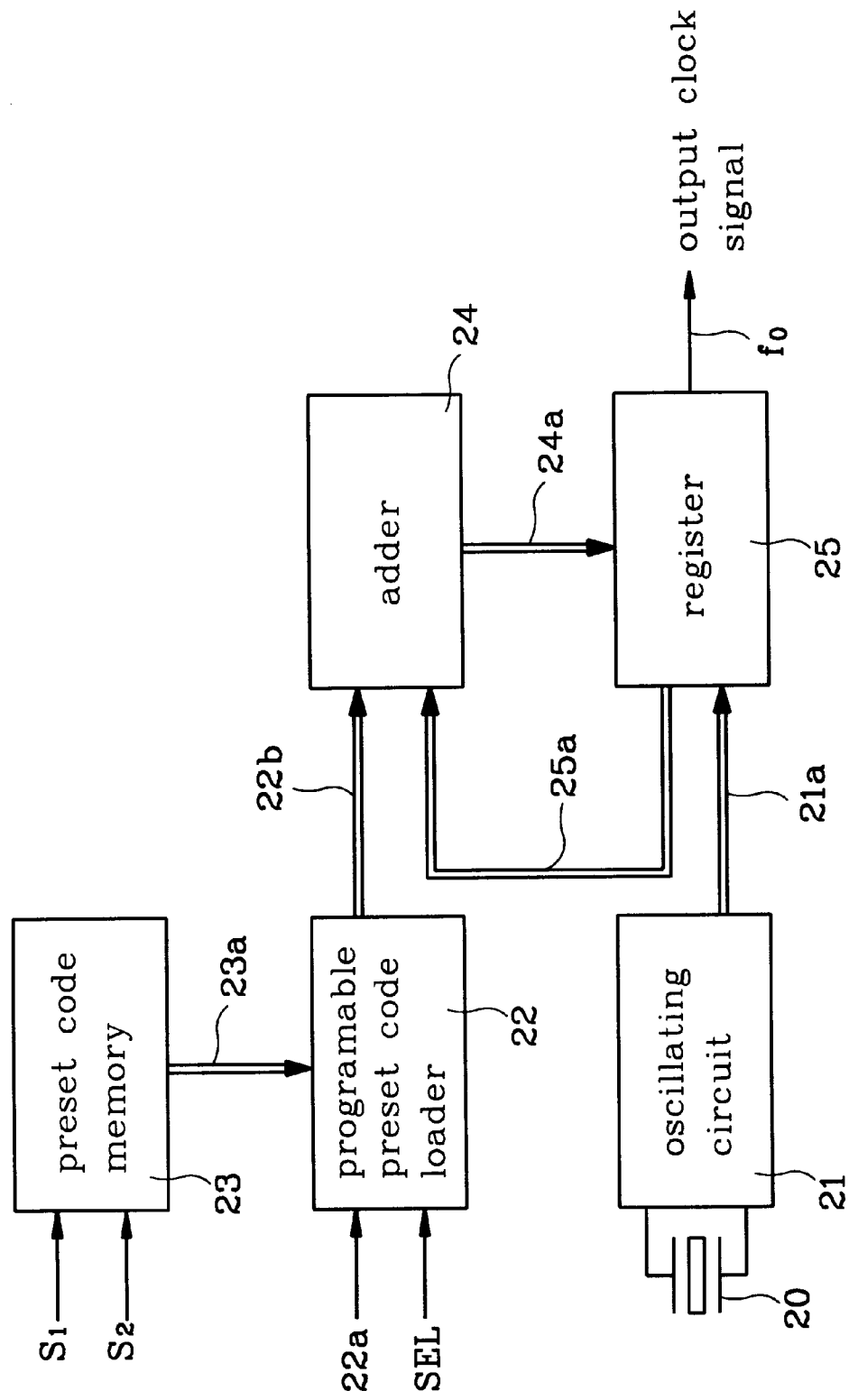
FIG. 2 is a functional block diagram of the present invention.

Referring now to FIG. 2, there is shown a functional block diagram of the programmable precise divider in accordance with the present invention. The divider includes a crystal 20, a low frequency oscillating circuit 21, a preset code memory 23, a programmable preset code loader 22, an adder 24, and a register 25. The crystal 20 is externally coupled to the low frequency oscillating circuit 21 to supply a basic clock signal source to the oscillating circuit 21.

In this embodiment, a preset code is stored in the preset code memory 23 in advance and may be loaded into the programmable preset code loader 22 via an output line 23a. Preferably, a set of preset codes may be stored in the preset code memory 23 and may be selected by means of selection control terminals S1 and S2. The programmable preset code loader 22 receives and latches one of the preset codes from the preset code memory 23. The output line 22b of the programmable preset code loader 22 is coupled to an input terminal of the adder 24, and thereby the preset code which is latched in the programmable preset code loader 22 is supplied to the adder 24.

The register 25 is provided with a first input terminal 21a which is coupled to the oscillating circuit 21, a second input terminal 24a which is coupled to the adder 24, a current value output terminal 25a which is coupled to the other input of the adder 24, and a clock signal output terminal fo.

In such an arrangement, the adder 24 adds the latched preset code present on line 22b to the current value present on line 25a, and then the resultant value of the adder 24 is supplied to the register 25 via the line 24a. The resultant value present on line 24a and the input clock signal derived from the oscillating circuit 21 is accumulated by the register 25, and thereby an output clock signal with desired frequency is supplied at the clock signal output terminal fo of the register 25.

In another preferred embodiment of the present invention, the programmable preset code loader 22 is loaded with a preset code from an external data source (not shown) via an external preset code input line 22a instead of the preset code loaded from the preset code memory 23. Preferably, a selection line SEL is available for the purpose of selecting the preset code source either from the preset code memory 23 or from the external preset code input line 22a.

To prove the effects of the present invention, various examples are taken hereafter. For example, in order to generate an output clock signal with a frequency of 2.4 KHz, the prior art frequency dividing approach with a crystal having an intrinsic oscillating frequency of 3.579545 MHz is first used. The divided frequencies of each stage of the divider are as follows:

The first stage divided frequency=3.579545 MHz/4= 894.886 KHz the second stage divided frequency=894.886 KHz/4= 298.295 KHz the third stage divided frequency=298.295 KHz/4=9.622 KHz the fourth stage divided frequency=9.622 KHz/4=2.406 KHz It is noted that a resultant output frequency of 2.406 KHz is obtained by dividing the input frequency by 1488. The error percentage is +0.23% in this case.

In case a crystal with a lower frequency of 445 KHz is used instead of the crystal above, the divided frequency of each stage of the divider will be as follows:

The first stage divided frequency=455KHz/3=151.667 KHz the second stage divided frequency=151.667 KHz/3= 50.556 KHz the third stage divided frequency=50.556 KHz/3=16.852 KHz the fourth stage divided frequency=16.852 KHz/7=2.407 KHz It is noted that a resultant output frequency of 2.407 KHz is obtained by dividing the input frequency by 189. The error percentage is +0.31% in this case.

In case a crystal with a further lower frequency of 32.768 KHz is used, the divided frequency of each stage of the divider will be as follows:

the first stage divided frequency=32.768 KHz/2=16.384 KHz the second stage divided frequency=16.384 KHz/7=2.341 KHz It is noted that a resultant output frequency of 2.341 KHz is obtained by dividing the input frequency by 14. The error percentage is −2.48% in this case.

From the examples above, it is found that the prior art approach has a problem that the divisor of each stage of the divider must be changed in case that another resultant output frequency is required.

Instead, a precise resultant output frequency may be obtained in accordance with the programmable frequency divider of the present invention by incorporating a low frequency crystal. For example, in case a crystal with a frequency of 32.768 KHz is used, and in case an output frequency of 2.400 KHz is required, the resultant output frequency is given by:

$$\frac{2400}{32768} \times 2^{10} \to 000100101 \quad \text{(use 10 digits preset code)}$$

$$32.768\text{KHz} \div \frac{1024}{75} = 2.400\text{KHz}$$

A precise resultant output frequency of 2.400 KHz is obtained. The error percentage is 0.00% in this case. Furthermore, it is possible to obtain another desired resultant output frequency by simply replacing the preset code with a new one. For example, in case an output frequency of 2.200 KHz is required, the algorithm is as follows:

$$\frac{2200}{32768} \times 2^{12} \to 00010001001 \quad \text{(use 12 digits preset code)}$$

$$32.768\text{KHz} \div \frac{4096}{275} = 2.200\text{KHz}$$

A resultant output frequency of 2.200 KHz is obtained. The error percentage is +0.00% in this case.

Figure 3:
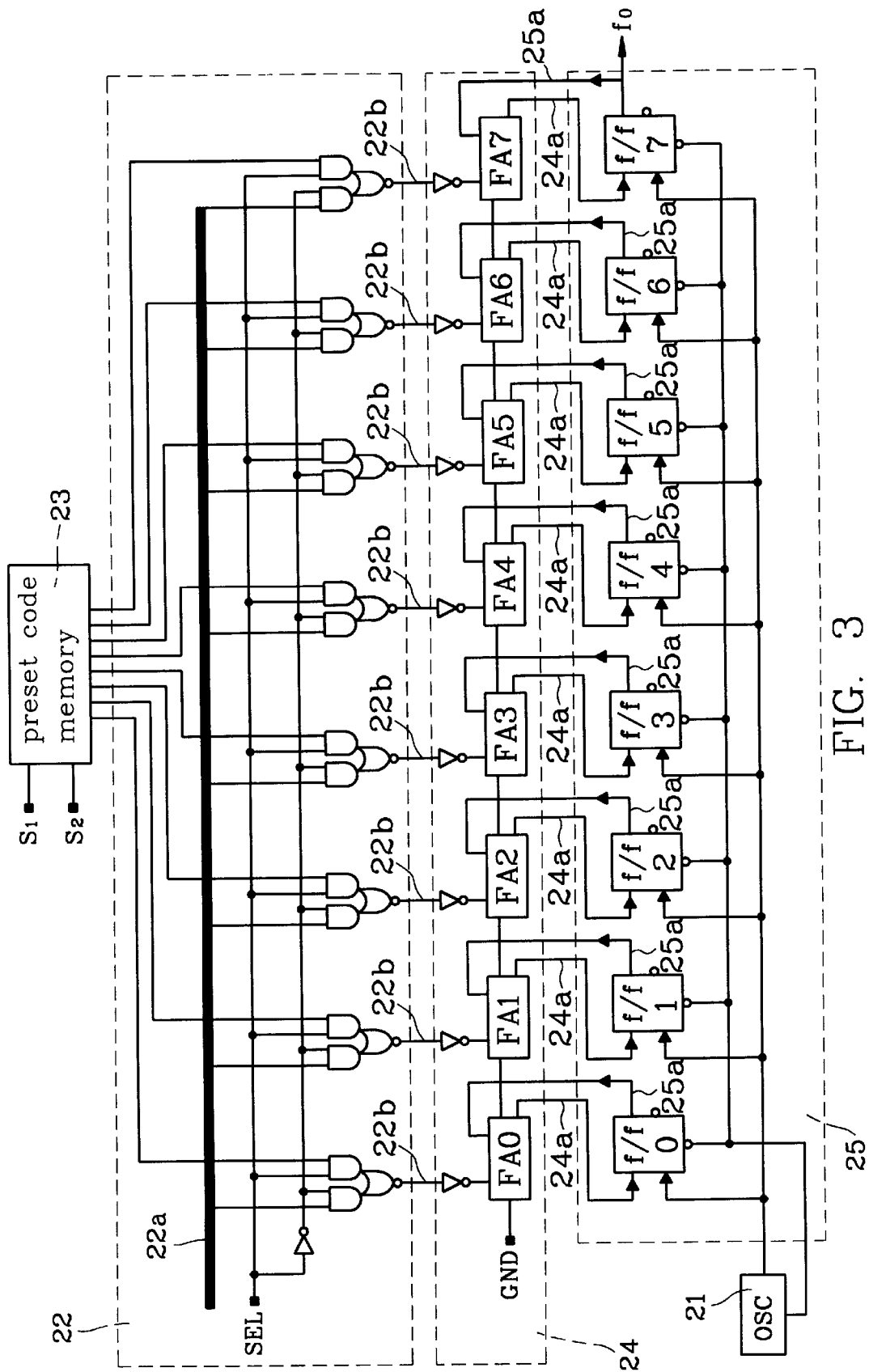
FIG. 3 is a logic diagram showing a preferred embodiment in accordance with present invention.

FIG. 3 is a logic diagram of the frequency divider in accordance with a preferred embodiment of the present invention. As shown in the drawing, a selection line SEL is available for the purpose of selecting the preset code source either from the preset code memory 23 or the external preset code input line 22a to the programmable preset code loader 22. In this embodiment, the external preset code input line 22a is in a form of data bus which is known in digital systems. In case the preset code memory 23 is selected, the preset code may be selected by means of preset code input terminals S1 and S2. The more bit numbers of the preset code is, the higher precision of the resultant output frequency is.

Further description of FIG. 3, the programmable preset code loader 22 includes eight sets of two AND gates with one NOR gate, responding to the eight bits outputted from the preset code memory 23. The adder 24 consists of eight full adders (FA0–FA7) to add the output line 22b and output terminal 25a. The output line 22b includes eight bits from the programmable preset code loader 22, and the output terminal 25a also includes eight bits from the register 25. In FIG. 3, the register 25 consists of eight flip-flops (f/f0–f/f7) to save the resultant value of the adder 24. The flip-flop can be a D-type flip-flop or R-S flip-flop to combine the register 25. So the FA's and the f/f's are parallel connected.

The every one FA (FA0–FA7) performing that one bit from the programmable preset code loader 22, added up with one bit from one flip-flop (f/f0–f/f7). So the adder 24 is consisted of the FA0–FA7 to perform the eight bits adding. Further, one flip-flop saves one bit, so the f/f0 through the f/f7 can save eight bits in this embodiment.

In accordance with the present invention, the binary form of the preset code may be determined by:

$$\frac{\text{Required Output Frequency}}{\text{System Frequency}} \times 2^{bit\,number} \Rightarrow \text{Binary Preset Code}$$

For example:

$$\frac{2400}{32768} \times 2^{10} \to 000100101$$

The resultant output frequency is determined by:

$$\text{System frequency} \div \frac{2^{bit\,number}}{\text{Decim Form Preset Code}} = \text{Resultant Frequency}$$

For example:

$$32768 \div \frac{2^{10}}{75} = 2.4\text{KHz}$$

The relation ship among the required input frequency, the resultant output frequency, and the error percentage of the conventional digital frequency divider is listed in Table I:

TABLE I

| required output frequency input freq. | F1 = 9.6 KHz | | F2 = 2.4 KHz | | F3 = 185 Hz | |
|---|---|---|---|---|---|---|
| | resultant freq./divisor | error | resultant freq./divisor | error | resultant freq./divisor | error |
| Fosc = 32768 Hz | 10.923 KHz/3 | +13.78% | 2.521 KHz/13 | +5.03% | 185.13 Hz/177 | +0.03% |
| | 8.192 KHz/4 | −14.68% | 2.341 KHz/14 | −2.48% | | |
| Fosc = 455 KHz | 9.681 KHz/47 | +0.84% | 2.407 KHz/189 | +0.31% | 185.03 Hz/2459 | +0.02% |
| | 9.479 KHz/48 | −1.26% | 2.395 KHz/190 | −0.22% | 184.96 Hz/2460 | −0.03% |
| Fosc = 3.58 MHz | 9.622 Hz/372 | +0.23% | 2.401 KHz/1491 | +0.03% | 185.01 Hz/19348 | <+0.01% |
| | 9.597 KHz/373 | −0.04% | 2.399 KHz/1492 | −0.04% | 185.00 Hz/19349 | <−0.01% |

In the TABLE 1, the frequency F2=2.4 kHz can be preset by user or by the programmable preset code loader 22 to calculate the bits code, then the OSC 21 oscillating with the bits code to sum up, the output frequency fo will be the 2.4 kHz. For the F1=9.6 kHz is the same way to output as the F2. The 32768 kHz is the oscillation frequency of the OSC 21, it also means the system frequency. From TABLE I, it is noted that the features of the conventional divider are:

a. The precision of the resultant output frequency depends on the externally applied oscillating frequency (input frequency). The higher the input frequency is, the higher precision of the resultant output frequency is.

b. Under the same externally applied oscillating frequency, the precision of the resultant output frequency may be kept only when the required output frequency is low.

The relation among the required output frequency, the input frequency, the resultant output frequency, and the error percentage of the digital frequency divider of the present invention is listed in Table II:

TABLE II

| required output frequency input freq. | F1 = 9.6 KHz | | F2 = 2.4 KHz | | F3 = 185 KHz | |
|---|---|---|---|---|---|---|
| | resultant freq./present code in binary form | error | resultant freq./present code in binary form | error | resultant freq./present code in briary form | error |
| Fosc = 32768 KHz | 9.216 KHz/010010 | −4.00% | 2.304 KHz/00010010 | −4.00% | 160 Hz/0000000101 | −13.5% |
| | 9.600 KHz/01001011 | −0.00% | 2.400 KHz/000100101 | −0.00% | 184 Hz/000000010111 | −0.54% |

It is noted from TABLE II, the precision of the resultant output frequency depends on the bit number of the preset code.

In conclusion, from the detail description above, it is obvious that the digital frequency divider of the present invention may get a precise output frequency by using a low cost and low frequency crystal. Furthermore, it is possible to get various resultant output frequencies by simply changing the preset code. When the divider of the present invention applies to an integrated circuit product, if only one output frequency is required, the preset code memory may be fabricated in the programmable preset code loader to simplify the circuitry of the divider and thereby reduce the component area of the integrated circuit.

It is apparent that although the invention has been described in connection with a preferred embodiment, those skilled in the art may make changes to certain features of the preferred embodiment without departing from the spirit and scope of the invention as defined in the appended claims.

We claim:

1. A programmable digital frequency divider, comprising:
an oscillating circuit with a crystal for providing an oscillating signal at a system frequency;

a preset code memory for storing a set of preset codes, wherein each of the preset codes is associated with the ratio between an output frequency to be supplied by the frequency divider and the system frequency;

a programmable preset code loader for loading and latching one of the preset codes from the preset code memory and then supplying a latched preset code;

register means having a first input terminal coupled to the oscillating circuit for receiving the oscillating signal from the oscillating circuit, a second input terminal, a current value output termnal for supplying a current value registered in the register, and a clock signal output terminal;

adding means for adding the latched preset code from the programmable preset code loader and the current value from the current value output terminal of the register and thereby supplying a resultant value to the second input terminal of the register; and accumulating means provided in said register means which accumulates the resultant value from the adding means to the oscillating signal generated by the oscillating circuit and then supplies an output clock signal at the clock signal output terminal of the register;

wherein:

(a) the preset code is a binary code determined by the following formula:

$$\text{preset code(in binary format)} \Rightarrow \frac{\text{output frequency to by supplied}}{\text{system frequency}} \times 2^N$$

wherein N is the number of bits of the preset code;

(b) said register means comprises N register, said adder means comprises N addres, and said N registers are connectes to said N addres, respectively;'

(c) each adder contains first input means to receive a corresponding "0" or "1" binary bit from said preset code loader; and (d) said preset code, said adder means, said register means and said accumulating means collectively convert the system frequency to an output frequency according to the following equation:

$$\text{output frequency} = \text{system frequency} \div \frac{2^N}{\text{decimal form of the preset code}}.$$

2. The programable digital frequency divider as claimed in claim 1, wherein the preset code memory is provided with a plurality of preset code selection control lines for selecting one of the preset codes stored in the preset code memory and supplying to the programmable preset code loader.

3. A programmable digital frequency divider, comprising:
an oscillating circuit with a crystal for providing an oscillating signal at a system frequency;
   a preset code input line for suppling a preset code, wherein the preset code is associated with the ratio between an output frequency to be supplied by the frequency divder and the system frequency; a programmable preset code for loading and latching the preset code from the preset code input line and then supplying a latched preset code;
   register means having a first input terminal coupled to the oscillating circuit for receiving the oscillating signal from the oscillating circuit, a second input terminal, a current value output termnal for supplying a current value registered in the register, and a clock signal output terminal;
   adding means for adding the latched preset code from the programmable preset code loader and the current value from the current value output terminal of the register and thereby supplying a resultant value to the second input terminal of the register, and
   accumulating means provided in the register means which accumulates the resultant value from the adding means to the oscillating signal generated by the oscillating circuit and then supplies an output clock signal at the clock signal output terminal of the register;
wherein:
   (a) the preset code is a binary code determined by the following formmula:

$$\text{preset code(in binary format)} \Rightarrow \frac{\text{output frequency to by supplied}}{\text{system frequency}} \times 2^N$$

where N is the number of bits of the preset code;
   (b) said register means comprises N registers, said adder means comprises N adders, and said N registers are connected to said N addres, respectively;
   (c) each adder contains first input means to receive a corresponding "0" or "1" binary bit from said preset code loader; and
   (d) said preset code, said adder means, said regsiter means and said accumulating means collectivelly convert the system frequency to an output frequency according to the following equation:

$$\text{output frequency} = \text{system frequency} \div \frac{2^N}{\text{decimal form of the preset code}}.$$

4. A programmable digital frequency divider, comprising:
an oscillating circuit with a low frequency crsytal for providing an oscillating signal at a system frequency;
   a preset code loader having a preset code therein, wherein the preset code is associated with the ratio between an ouput frequency to be supplied by the frequency divider and the system frequency;
   register means having a first input terminal coupled to the oscillating circuit for receiving the oscillating signal from the oscillating circuit, a second input terminal, a current value output terminal for supplying a current value registered in the register, and a clock signal output terminal;
   adding means for adding the preset code from the preset code loader and and current value from the current value output terminal of the register and thereby supplying a resultatnt value to the second input terminal of the register; and
   accumulating means provided in the register means which accumulates the resultant value from the adding means to the oscillating signal generated by the oscillating circuit and then supplied an output clock signal at the clock signal output terminal of the register;
wherein:
   (a) the prest code is a binary code determined by the following formula:

$$\text{preset code(in binary format)} \Rightarrow \frac{\text{output frequency to by supplied}}{\text{system frequency}} \times 2^N$$

wherein N is the number of bits of the preset code;
   (b) said register means comprises N registers, said adder means comprises N adders, and said N registers are connected to said N addres, respectively;
   (c) each other contains first input means to receive a corresponding "0" or "1" binary bit from said preset code loader; and
   (d) said preset code, said adder means, said register means and said accumulating means collectively convert the system frequency to an output frequency according to the following equation:

$$\text{output frequency} = \text{system frequency} \div \frac{2^N}{\text{decimal form of the preset code}}.$$

5. A programmable digital frequency divider, comprising:
an oscillating circuit with a low frequency crystal for providing an oscillating signal at a system frequency;
a preset code memory for storing a set of preset codes;
a preset code input line for suppling a preset code, wherein the preset code is associated with the ratio between an output frequency to be supplied by the frequency divider and the system frequency;
a programmable preset code loader provided with a preset code selection line, for loading and latching the preset code either from the preset code memory or the preset code input line under control of the preset code selection line, and then supplying a latched preset code;
register means havilng a first input terminal coupled to the oscillating circuit for receiving the oscillating signal from the oscillating circuit, a second input terminal, a current value output terminal for supplying a current value registered in the register, and a clock signal output terminal;
adding means for adding the latched preset code from the programmable preset code loader and the current value from the current value output terminal of the register and thereby supplying a resulatant value to the second input terminal of the register; and accumulating means provided in the register means which accumulates the resultant value from the adding means to the oscillating signal generated by the oscillating circuit and then supplies an output clock signal at the clock signal output terminal of the register;

wherein:

(a) the preset code is a binary code determined by the following formula:

$$\text{preset code(in binary format)} \Rightarrow \frac{\text{output frequency to by supplied}}{\text{system frequency}} \times 2^N$$

wherein N is the number of bits of the preset code;

(b) said register means comprises N register, said adder means comprises N adders, and said N registers are connected to said N addres, respectively;

(c) each adder contains first input means to receive a corresponding "0" or "1" binary bit from said preset code loader; and (d) said preset code; said adder means, said register means and said accumulating means collectively convert the system frequency to an output frequency according to the followng equation:

$$\text{output frequency} = \text{system frequency} \div \frac{2^N}{\text{decimal form of the preset code}}.$$

6. The programable digital frequency divider as claimed in claim 5, wherein the preset code memory is provided with a plurality of preset code selection control lines for selecting one of the preset codes stored in the preset code memory and supplying to the programmable preset code loader.

* * * * *